United States Patent
Zhang

(10) Patent No.: US 9,254,510 B2
(45) Date of Patent: Feb. 9, 2016

(54) DRYING APPARATUS WITH EXHAUST CONTROL CAP FOR SEMICONDUCTOR WAFERS AND ASSOCIATED METHODS

(75) Inventor: John H. Zhang, Fishkill, NY (US)

(73) Assignee: STMICROELECTRONICS, INC., Coppell, TX (US)

(*) Notice: Subject to any disclaimer, the term of this patent is extended or adjusted under 35 U.S.C. 154(b) by 941 days.

(21) Appl. No.: 13/365,401

(22) Filed: Feb. 3, 2012

(65) Prior Publication Data
US 2013/0199580 A1 Aug. 8, 2013

(51) Int. Cl.
| | |
|---|---|
| H01L 21/67 | (2006.01) |
| B08B 1/04 | (2006.01) |
| A46B 13/02 | (2006.01) |
| F26B 21/00 | (2006.01) |
| A46B 13/00 | (2006.01) |

(52) U.S. Cl.
CPC ............ *B08B 1/04* (2013.01); *A46B 13/001* (2013.01); *A46B 13/02* (2013.01); *F26B 21/00* (2013.01); *H01L 21/67034* (2013.01); *H01L 21/67046* (2013.01); *Y10T 29/494* (2015.01); *Y10T 137/8593* (2015.04)

(58) Field of Classification Search
CPC ............ H01L 21/67034; H01L 21/67028; H01L 21/6719; H01L 21/67751; B08B 15/00; B08B 13/00; F26B 21/00; A46B 13/001; A46B 13/02
USPC ............ 134/95.2, 200; 34/92, 104, 201, 202, 34/218, 86, 82, 487, 80, 235; 414/217, 414/939, 805, 935, 220; 137/561 R, 583, 137/584, 587, 588, 589
See application file for complete search history.

(56) References Cited

U.S. PATENT DOCUMENTS

| | | | |
|---|---|---|---|
| 3,106,831 A | 10/1963 | Behrens | |
| 5,435,075 A * | 7/1995 | Shiraishi et al. | 34/58 |
| 7,513,062 B2 | 4/2009 | Achkire et al. | 34/482 |
| 2005/0247675 A1 | 11/2005 | Eissa et al. | 216/105 |
| 2007/0113423 A1* | 5/2007 | Tanaka et al. | 34/486 |
| 2008/0138508 A1 | 6/2008 | Takagi et al. | 427/123 |
| 2009/0029560 A1* | 1/2009 | Hansen et al. | 438/745 |
| 2009/0098297 A1* | 4/2009 | Sakai et al. | 427/314 |

* cited by examiner

*Primary Examiner* — David Cormier
*Assistant Examiner* — Irina Graf
(74) *Attorney, Agent, or Firm* — Allen, Dyer, Doppelt, Milbrath & Gilchrist, P.A.

(57) ABSTRACT

A drying apparatus for drying a semiconductor wafer includes a processing chamber including a rinsing section and a drying section adjacent thereto. The rinsing section has a chamber loading slot associated therewith for receiving the semiconductor wafer. The drying section has a chamber unloading slot associated therewith for outputting the semiconductor wafer. An exhaust control cap is carried by the processing chamber and includes a bottom wall, a top wall, at least one intermediate wall between the bottom and top walls, and a side wall coupled to the top, bottom and the at least one intermediate wall to define stacked exhaust sections. The exhaust control cap has a cap loading slot aligned with the chamber loading slot, a cap unloading slot aligned with the chamber unloading slot, and at least one exhaust port configured to be coupled to a vacuum source.

24 Claims, 14 Drawing Sheets

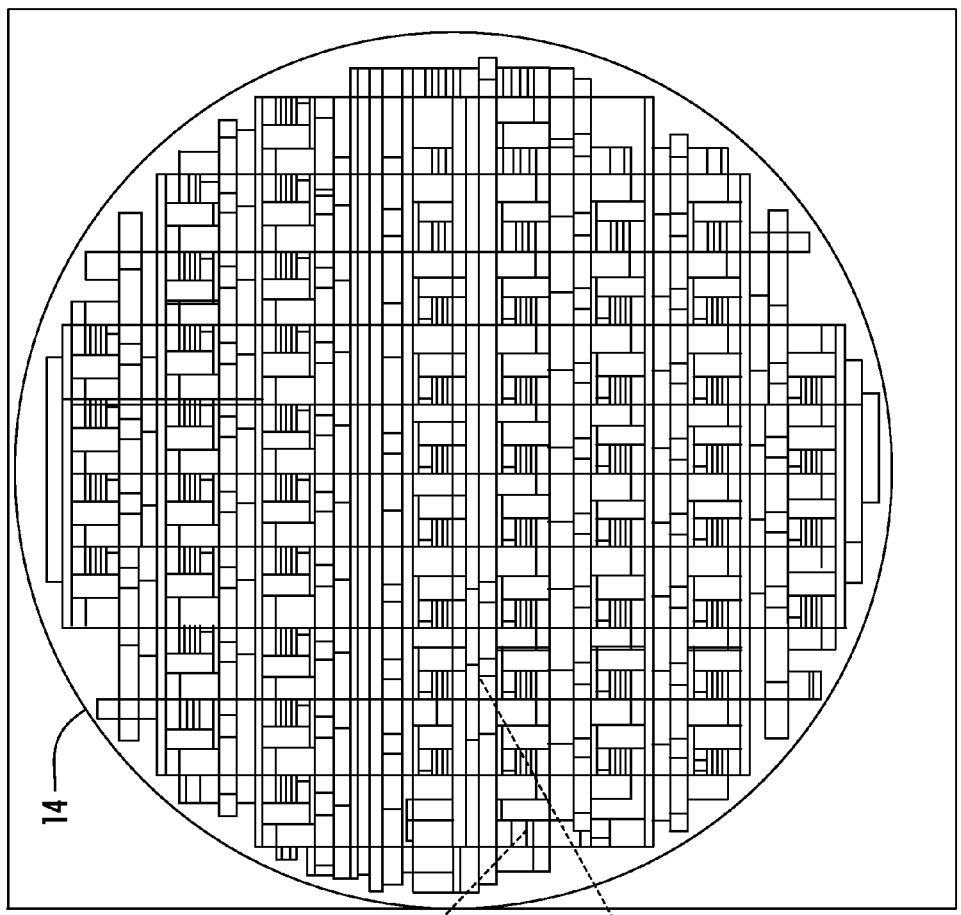
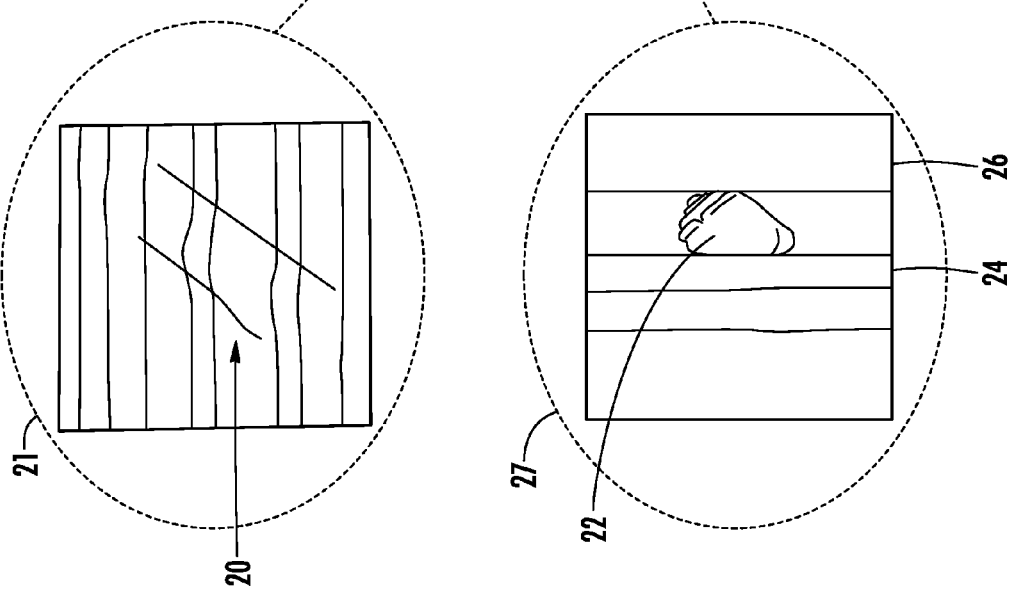
FIG. 2
PRIOR ART

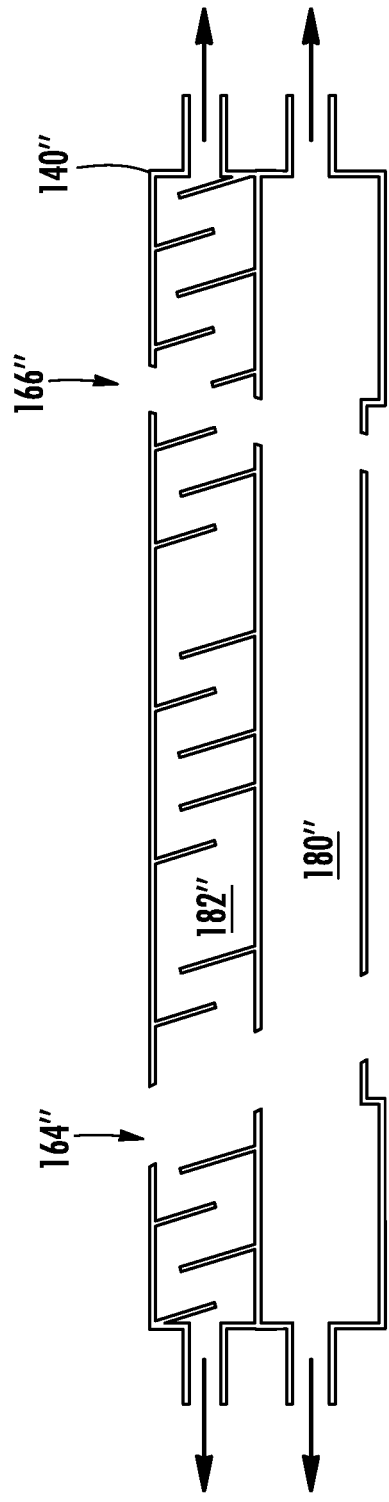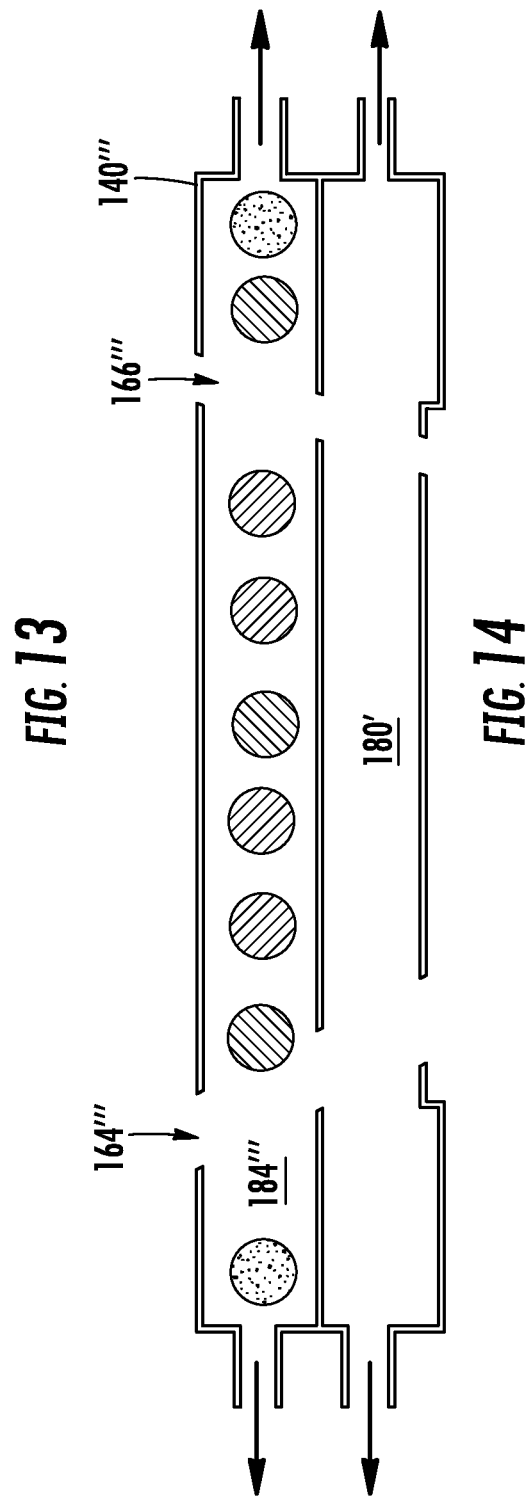

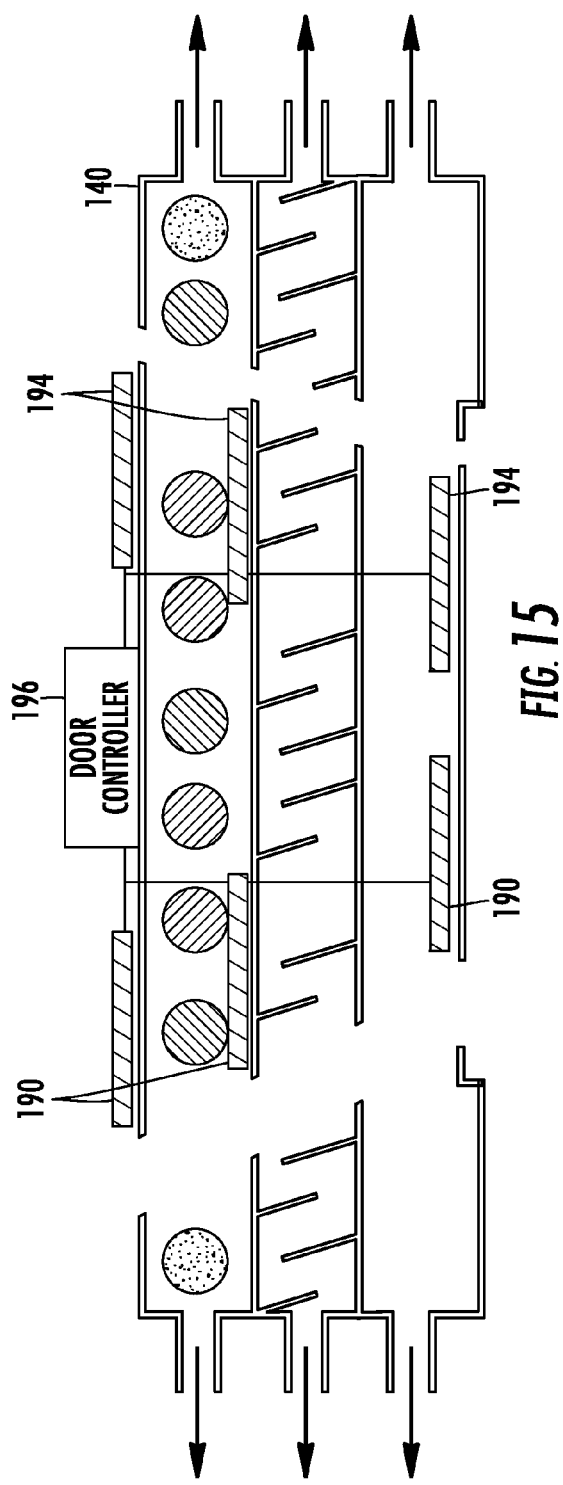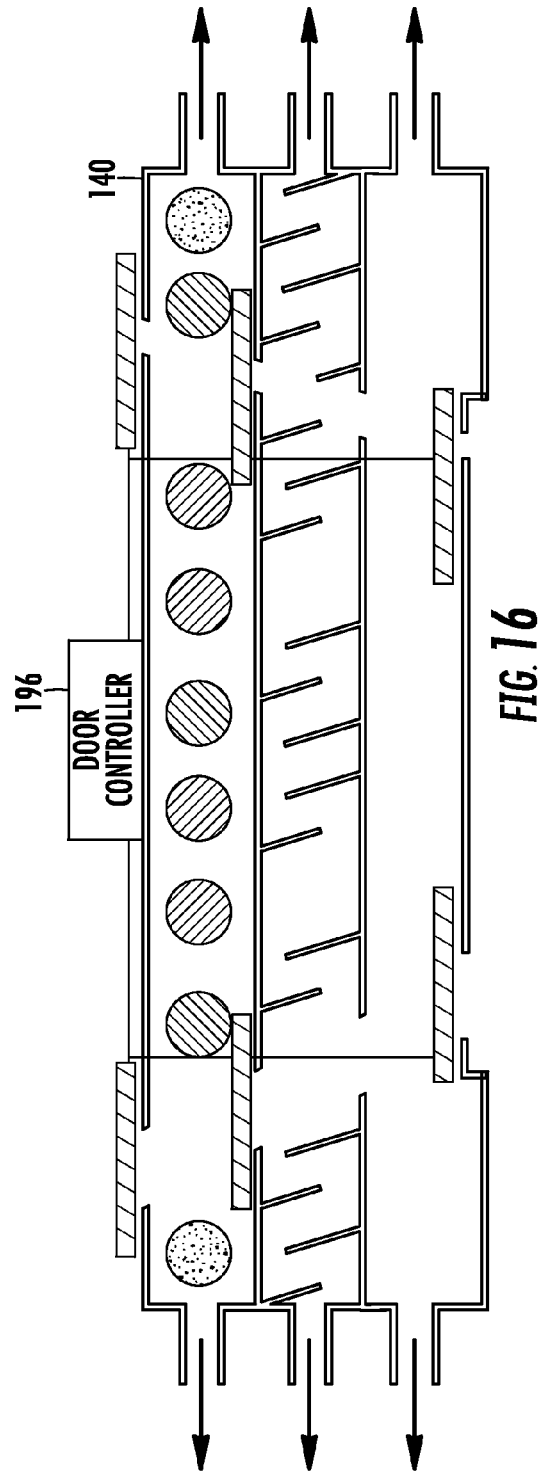

DRYING APPARATUS WITH EXHAUST CONTROL CAP FOR SEMICONDUCTOR WAFERS AND ASSOCIATED METHODS

FIELD OF THE INVENTION

The present invention relates to the field of semiconductor wafers, and more particularly, to an apparatus and method for rinsing and drying semiconductor wafers.

BACKGROUND OF THE INVENTION

Chemical-mechanical polishing (CMP) is performed in the processing of semiconductor wafers. A standard CMP apparatus has a circular polishing pad and a rotating carrier for holding a semiconductor wafer. An abrasive slurry is used on the polishing pad. After a CMP operation, residual particles are left on the surface of the semiconductor wafer. These residual particles need to be removed.

Semiconductor wafers are typically cleaned in a cleaning apparatus which includes one or more brush stations each having a pair of rotary brushes for cleaning the major surfaces of the wafers. A conventional cleaning apparatus 10 is illustrated in FIG. 1. The cleaning apparatus 10 includes a pair of brushes 11 that clean the major surfaces of a semiconductor wafer 14 placed therebetween. The semiconductor wafer 14 is supported by rollers 16, which are also used to rotate the wafer. The cleaning apparatus 10 includes at least one spray bar 18 to direct a spray of fluid towards the semiconductor wafer 14.

As semiconductor processes continue to achieve smaller line widths to create semiconductor wafers with greater capacity, post CMP defects control becomes more important for improving wafer yield and reliability. A key factor in brush cleaning is to precisely control the distance between the brush and the semiconductor wafer. If the separation distance is too tight, the residual particles from the CMP operation will scratch 20 the semiconductor wafer 14 as they are brushed off, as illustrated in a highlighted section 21 of the wafer as provided in FIG. 2. If the separation distance is to loose, some of the residual particles will not be removed. For example, a residual particle 22 may cause a short between two lines 24 and 26, as illustrated in a highlighted section 27 of the wafer as also provided in FIG. 2.

After the cleaning apparatus, the semiconductor wafer is placed in a drying apparatus. A conventional drying apparatus is also referred to as a spin-rinse/dryer, and includes a processing chamber comprising a rinsing section and a drying section adjacent thereto. The sequence in the drying apparatus includes spinning the semiconductor wafer in the rinsing section while rinsing with a rinsing liquid, and then spinning the wafer in the drying section to dry. The rinsing section is to remove any residual particles not removed by the cleaning apparatus, whereas the drying section is to remove any residue marks left on a semiconductor wafer after rinsing.

Vapor within the drying section needs to be contained and exhausted so as to avoid contamination of the semiconductor wafer as it is removed from the drying apparatus. As the semiconductor wafer is removed, DI water or an IPA flow rate spike may cause a water mark or IPA to condense on the semiconductor wafer. This will lead to wafer yield and reliability being decreased. One approach to avoiding contamination is disclosed in U.S. Pat. No. 7,513,062. An exhaust control cap is provided for the drying apparatus and includes an exhaust manifold and a nitrogen blanket manifold. A gas flow module is coupled to the exhaust manifold and the nitrogen blanket manifold to control the vapor flow rate, the exhaust rate and the nitrogen blanket flow rate. In addition, an exhaust line may maintain a vertical laminar flow through the output portion, as well as diluting any vapor that may escape from the drying section.

Further developments to contain and exhaust vapor from the drying section of a drying apparatus are still desired. This is particularly so if the rinsing liquid within the rinsing section is toxic.

SUMMARY OF THE INVENTION

In view of the foregoing background, it is therefore an object of the present invention to improve how vapor from the drying section of a drying apparatus is contained and exhausted.

This and other objects, features, and advantages in accordance with the present invention are provided by a drying apparatus for drying a semiconductor wafer comprising a processing chamber comprising a rinsing section and a drying section adjacent thereto, with the rinsing section having a chamber loading slot associated therewith for receiving the semiconductor wafer, and with the drying section having a chamber unloading slot associated therewith for outputting the semiconductor wafer. An exhaust control cap may be carried by the processing chamber and comprises a bottom wall, a top wall, at least one intermediate wall between the bottom and top walls, and a side wall coupled to the top wall, the bottom wall and the at least one intermediate wall to define a plurality of stacked exhaust sections. The exhaust control cap may have a cap loading slot aligned with the chamber loading slot, a cap unloading slot aligned with the chamber unloading slot, and at least one exhaust port configured to be coupled to a vacuum source.

The plurality of stacked exhaust sections may include any combination of a hollow section, a baffled section and/or a chemical species trap section. The at least one exhaust port may comprise at least one exhaust port for each exhaust section.

The exhaust control cap advantageously contains and exhausts vapor from the processing chamber of the drying apparatus, and in particular, in the drying section. The stacked exhaust sections help to reduce exhaust contamination of the semiconductor wafer as it is being removed from the drying apparatus, which in turn improves wafer yield and reliability.

The cap and chamber loading slots may be aligned in a non-vertical direction with respect to an upper surface of the processing chamber, and the cap and chamber unloading slots may also be aligned in a non-vertical direction with respect to the upper surface of the processing chamber.

The exhaust control cap may further comprise at least one cap loading slot door slideably positioned over the cap loading slot, and at least one cap unloading slot door slideably positioned over the cap unloading slot. A door controller may be configured to operate the at least one cap loading and unloading slot doors based on a position of the semiconductor wafer.

Another aspect is directed to an exhaust control cap for a semiconductor wafer drying apparatus as described above.

Another aspect is directed to a method for making an exhaust control cap for a semiconductor wafer drying apparatus. The method may comprise forming a plurality of stacked exhaust sections defined by a bottom wall, a top wall, at least one intermediate wall, and a side wall coupled to the bottom wall, the top wall and the at least one intermediate wall. The method may further comprise forming a cap loading slot to be aligned with a chamber loading slot in the drying apparatus, and forming a cap unloading slot to be aligned with a chamber unloading slot in the drying apparatus. At least one exhaust port may be formed for the plurality of stacked exhaust ports to be coupled to a vacuum source.

BRIEF DESCRIPTION OF THE DRAWINGS

FIG. 2 is a semiconductor wafer with highlighted sections illustrating a scratch and a residual particle not removed during a cleaning operation in accordance with the prior art.

FIGS. 12, 13 and 14 are cross-sectional side views of different embodiments of an exhaust control cap in accordance with the present invention.

FIG. 15 is a cross-sectional side view of the exhaust control cap illustrated in FIG. 11 with cap loading and unloading slot doors in the open position.

FIG. 16 is a cross-sectional side view of the exhaust control cap illustrated in FIG. 11 with cap loading and unloading slot doors in the closed position.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notations are used to indicate similar elements in alternative embodiments.

Figure 1:
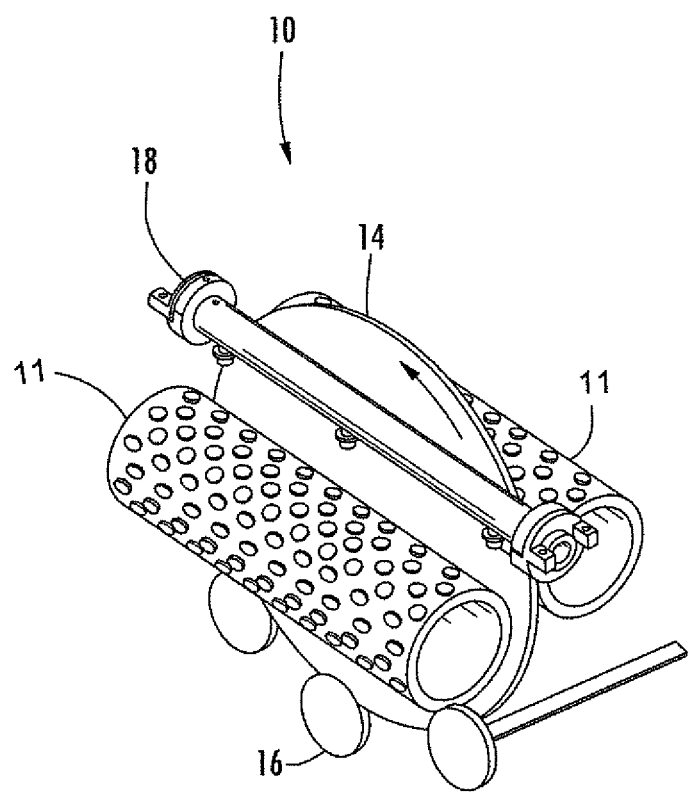
FIG. 1 is a perspective view of a brush cleaning apparatus in accordance with the prior art.
Figure 3:
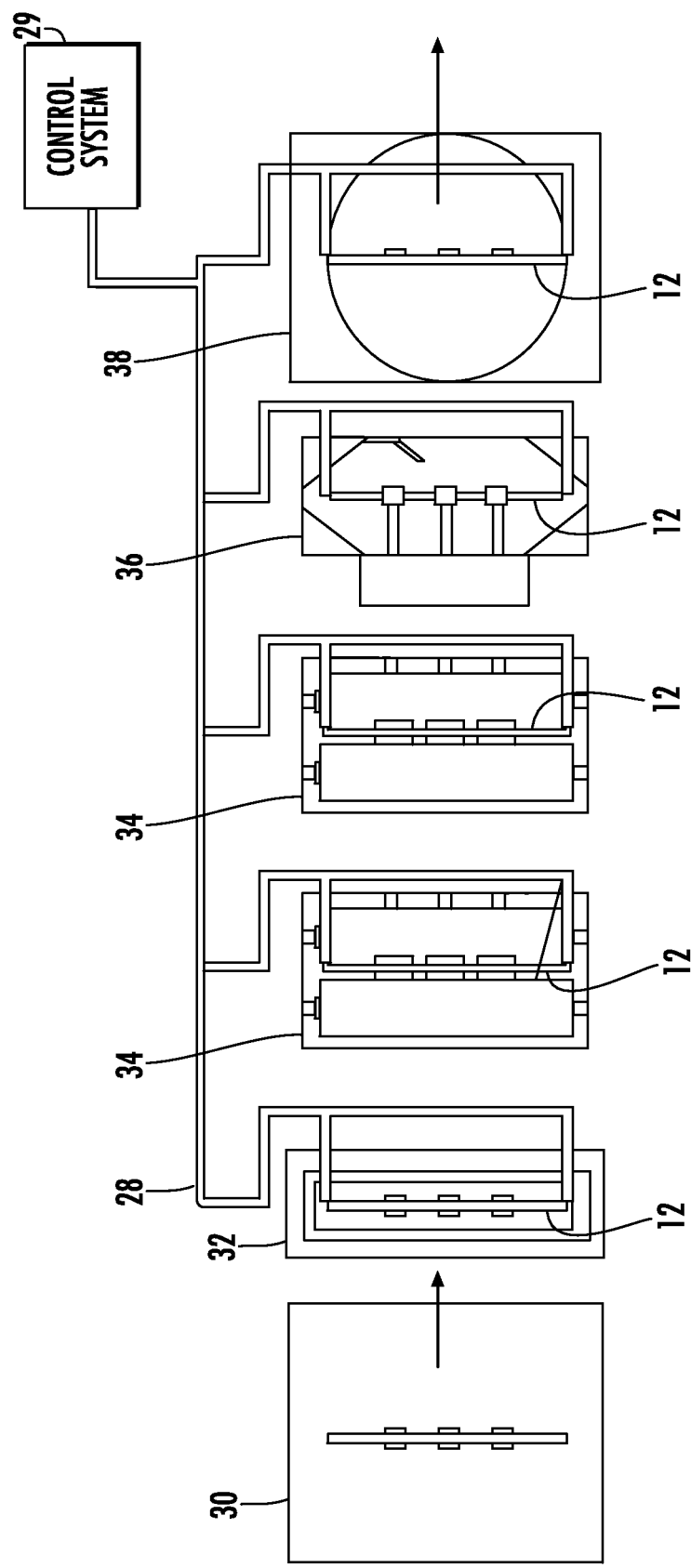
FIG. 3 is a schematic diagram of post CMP cleaning stations in accordance with the present invention.

An overview of post chemical-mechanical polishing (CMP) cleaning stations used to clean semiconductor wafers 12 after CMP will initially be discussed in reference to FIG. 3. Each clean station represents one or more steps in the post CMP wafer buffing and cleaning process. For maximum throughput, at least one semiconductor wafer 12 is simultaneously processed by each clean station. Control and synchronization of the clean stations are provided via a connected interface 28 coupled to a control system 29.

As readily appreciated by those skilled in the art, an acidic (low pH) cleaning process is used. The cleaning process may include a hydrofluoric (HF) or standard clean 1 (SC2) cleaning process. To withstand the corrosive effects of the acid, plastic components in the different stations may be used. The plastic may include materials such as PET, aceta (DELRIN), teflon, polypropylene (polypro), polyuerethane. Metal components may also be used, such as stainless steel.

Prior to cleaning, the semiconductor wafers 12 are stored in a wet load station 30. The first clean station is a megasonic tank 32, which uses acoustic waves to initially clean the semiconductor wafer 12. Similar to ultrasonic cleaning, megasonics utilizes a transducer, usually composed of piezoelectric crystals to create megasonic energy. Megasonic energy is of a higher frequency (800-2000 kHz) than typical ultrasonic cleaners (<100 kHz). As a result, the cavitation that occurs is gentler and on a much smaller scale.

The second and third clean stations are brush cleaning apparatuses 34. After the initial cleaning of the semiconductor wafer 12 in the megasonic tank 32, the wafer is subjected to back-to-back brush cleaning. Each brush cleaning apparatus 32 may use dionized (DI) water as part of the cleaning process. In some applications, hydrofluoric (HF) acid may be used as an alternative. Each semiconductor wafer 12 is brushed and sprayed to remove any residual particles thereon. Both sides of a semiconductor wafer 12 are brushed simultaneously. A semiconductor wafer 12 is cleaned by applying equal amounts of pressure to both ends of the brush assembly for a predetermined period of time. Alternatively, the brush cleaning apparatuses 34 may be configured to brush one side at a time.

After each semiconductor wafer 12 has been brushed twice, the next clean station is a drying apparatus 36. The drying apparatus 36 is also known as a spin-rinse/dryer 36 since it rinses, spins, and dries a semiconductor wafer 12. A spun and dried wafer 12 is then moved to an unload station 38. A semiconductor wafer 12 in the unload station 38 represents a clean wafer.

Figure 5:
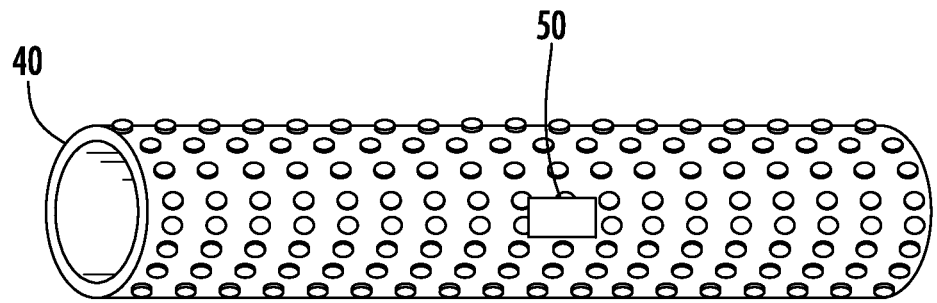
FIG. 5 is a perspective view of a rotary brush from the brush cleaning apparatus shown in FIG. 4 with a single optical window integrated therein.
Figure 6:
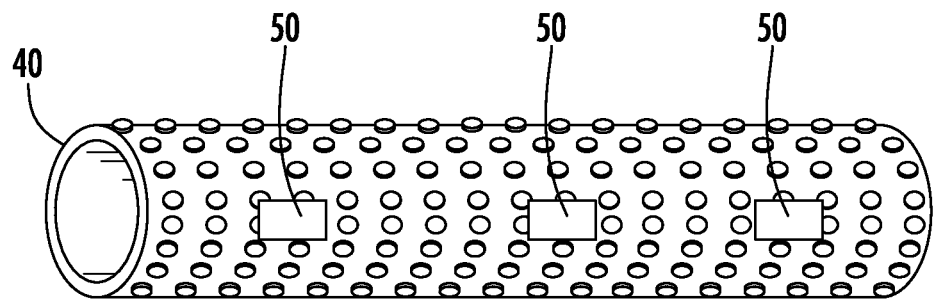
FIG. 6 is a perspective view of a rotary brush from the brush cleaning apparatus shown in FIG. 4 with multiple optical windows integrated therein.

A brush cleaning apparatus 34 from the second and third stations will now be discussed in greater detail in reference to FIGS. 4-6. The brush cleaning apparatus 34 is configured the same for each station, and includes a pair of rotary brushes 40 each configured to be positioned to clean a semiconductor wafer 12. An optical sensing device 42 is associated with each rotary brush 40 to sense a separation distance between a reference position 44 thereon and the semiconductor wafer 12. An actuator 47 is coupled to each optical sensing device 42 and is configured to position the rotary brush 40 based upon the separation distance between the reference position 44 on the rotary brush 40 and the semiconductor wafer 12.

By precisely controlling the separation distance between the rotary brushes 40 and the semiconductor wafer 12 with respect to the reference position 44, wafer yield and efficiency are advantageously improved. As noted above, if the separation distance is too tight, residual particles from a CMP operation may scratch the semiconductor wafer 12 as they are brushed off. If the separation distance is too loose, some of the residual particles will not be removed. Since the semiconductor wafer 12 is a double sided wafer, the same components are installed on the other side of the wafer.

Determination and control of the separation distance between the rotary brush 40 and the semiconductor wafer 12 with respect to a reference position is performed before brushing begins. This reduces the chance of having distorted measurements that may be caused by wetting solutions being applied to surfaces of the semiconductor wafer 12 during cleaning. Nonetheless, determination and control of the separation distance may be made in situ (i.e., during cleaning) provided the measurements are not distorted.

In the illustrated embodiment, the optical sensing device 42 is positioned inside or within the rotary brush 40. Consequently, each rotary brush 40 includes an optical window 60 formed therein, as illustrated in FIG. 5. The optical sensing device 42 includes an optical transmitter 46 and an optical receiver 48. The optical transmitter 46 transmits an optical signal 50 through the optical window 60 to the semiconductor wafer 12. This results in a reflected optical signal 52 being directed back through the optical window 60 to the optical receiver 48.

A controller 70 is coupled between the optical sensing device 42 and the actuator 47. The controller 70 uses the optical signals 50, 52 to determine the separation distance between the reference position 44 on the rotary brush 40 and semiconductor wafer 12, as readily appreciated by those skilled in the art.

The actuator 47 is coupled to an arm 72 that is coupled to at least one side of the rotary brush 40. Although not illustrated, the other side of the rotary brush 40 may be coupled to a motor that rotates the brush. The illustrated embodiment is not limited to the support mechanisms (e.g., arm 72) used to support a rotary brush 40. Other support mechanism may be used. In addition, the rotary brushes 40 may be enclosed within a chamber, although not illustrated.

The actuator 47 is under the control of the controller 70. In the illustrated embodiment, the controller 70 is separate from the optical sensing device 42. Alternatively, the controller 70 may be positioned within the optical sensing device 42.

The controller 70 includes a processor 74 to determine the separation distance between the rotary brush 40 and the semiconductor wafer 12 with respect to the reference position 44. This determination is made based on the optical signal 50 and the corresponding reflected optical signal 52, as readily appreciated by those skilled in the art. Even though the reference position 44 is illustrated with respect to a front face of the optical sensing device 42, the reference position may be picked to be a different location. The processor 74 also determines a difference between the sensed separation distance and a desired separation distance, and operates the actuator 47 based on the determined difference.

To uniformly measure the separation distance between the rotary brush 40 and the semiconductor wafer 12 with respect to the reference position 44, multiple optical sensing devices 42 may be positioned within the rotary brush 40. The rotary brush 40 would then have an optical window 60 for each optical sensing device 42 positioned therein. For example, if the rotary brush 40 included three optical sensing devices 42 positioned therein, then there would be three optical windows 60, as illustrated in FIG. 6.

As readily appreciated by those skilled in the art, each rotary brush 40 may be porous and/or sponge like and may include a resilient material, such as polyvinyl acetate (PVA). The rotary brushes 40 may also include other materials, or may include different materials. The type of brushes 40 have an effect on the desired separation distance between the reference position 44 and the surface of the semiconductor wafer 12 even though the brushes contact the surfaces of the semiconductor wafer 12 being cleaned.

Figure 4:
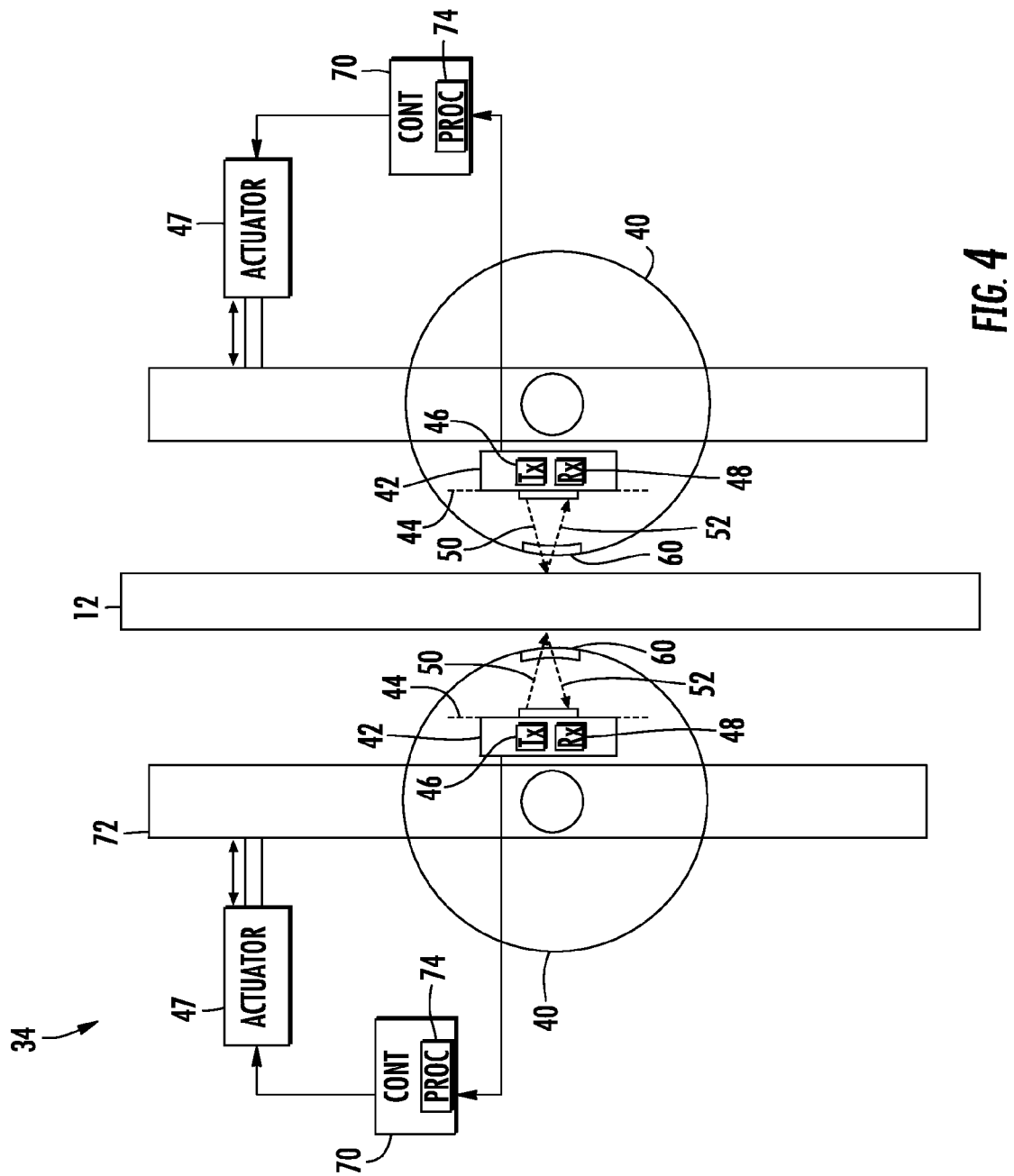
FIG. 4 is a schematic diagram of a brush cleaning apparatus with optical sensing devices inside the rotary brushes in accordance with the present invention.

Each optical window 60 may be formed as a separate component with respect to a corresponding optical sensing device 42 associated therewith, as illustrated in FIG. 4. In this configuration, the optical window 60 is held in place by the rotary brush 40. That is, the optical window 60 is integrated into the rotary brush 40. The optical sensing device 42 is positioned within the rotary brush 40 separately from the optical window 60. Alternatively, each optical window 60 may be formed to directly contact or connect with a corresponding optical sensing device 42. In this configuration, the optical sensing device 42 and optical window 60 are positioned within the rotary brush 40 at the same time.

Each optical window 60 may be formed out of plastic or glass, for example. Other materials that are transparent to the optical signals 50, 52 are readily acceptable also.

Figure 7:
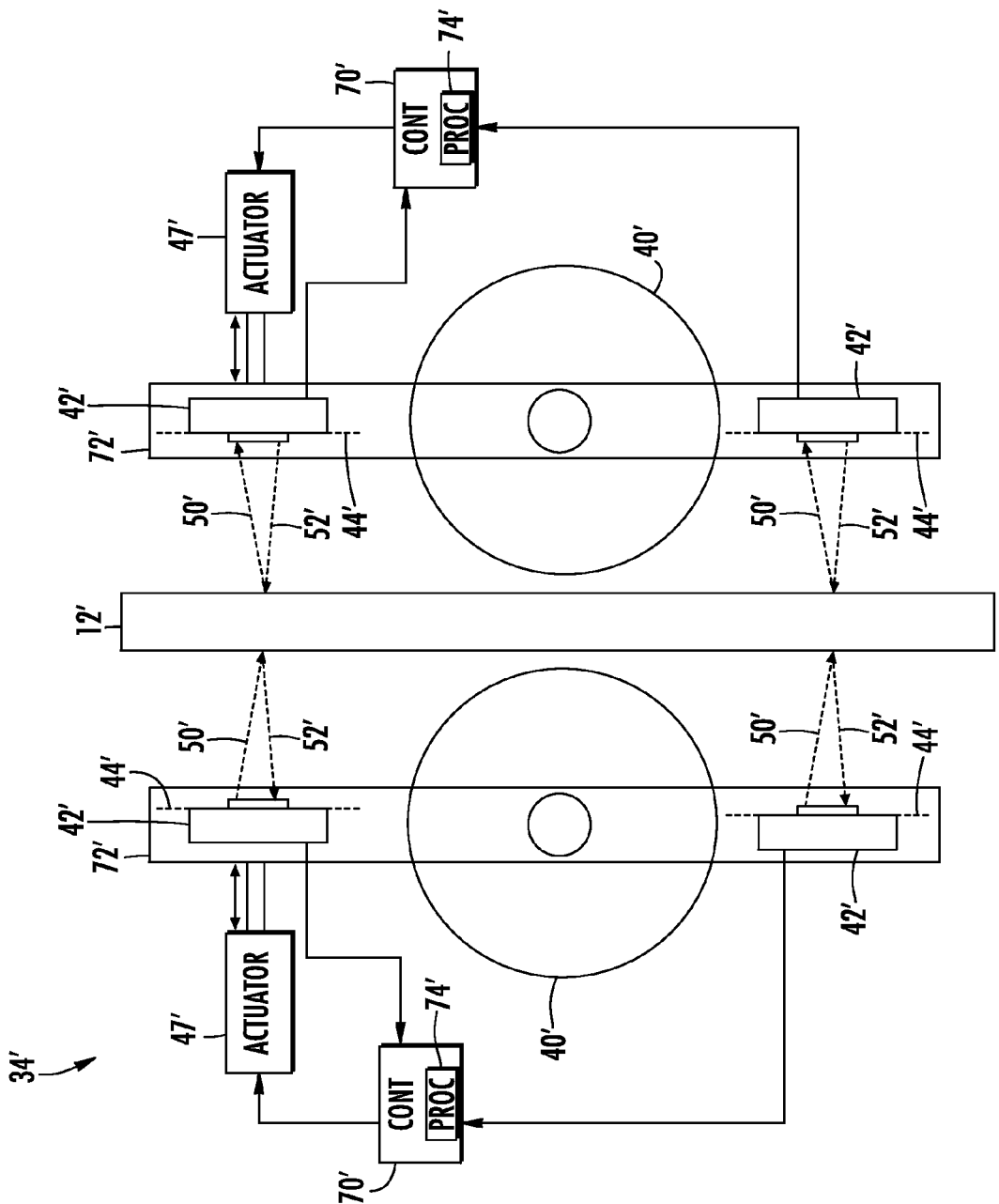
FIG. 7 is a schematic diagram of the brush cleaning apparatus shown in FIG. 4 with the optical sensing devices outside the rotary brushes.

Referring now to FIG. 7, another embodiment of the brush cleaning apparatus 34' is based on the optical sensing devices 42' being outside or external from the rotary brushes 40'. For example, one or more optical sensing devices 42' are carried by an arm 72' used to support at least one side of the rotary brush 40'. In this embodiment, the rotary brushes 40' no longer require an optical window.

Figure 8:
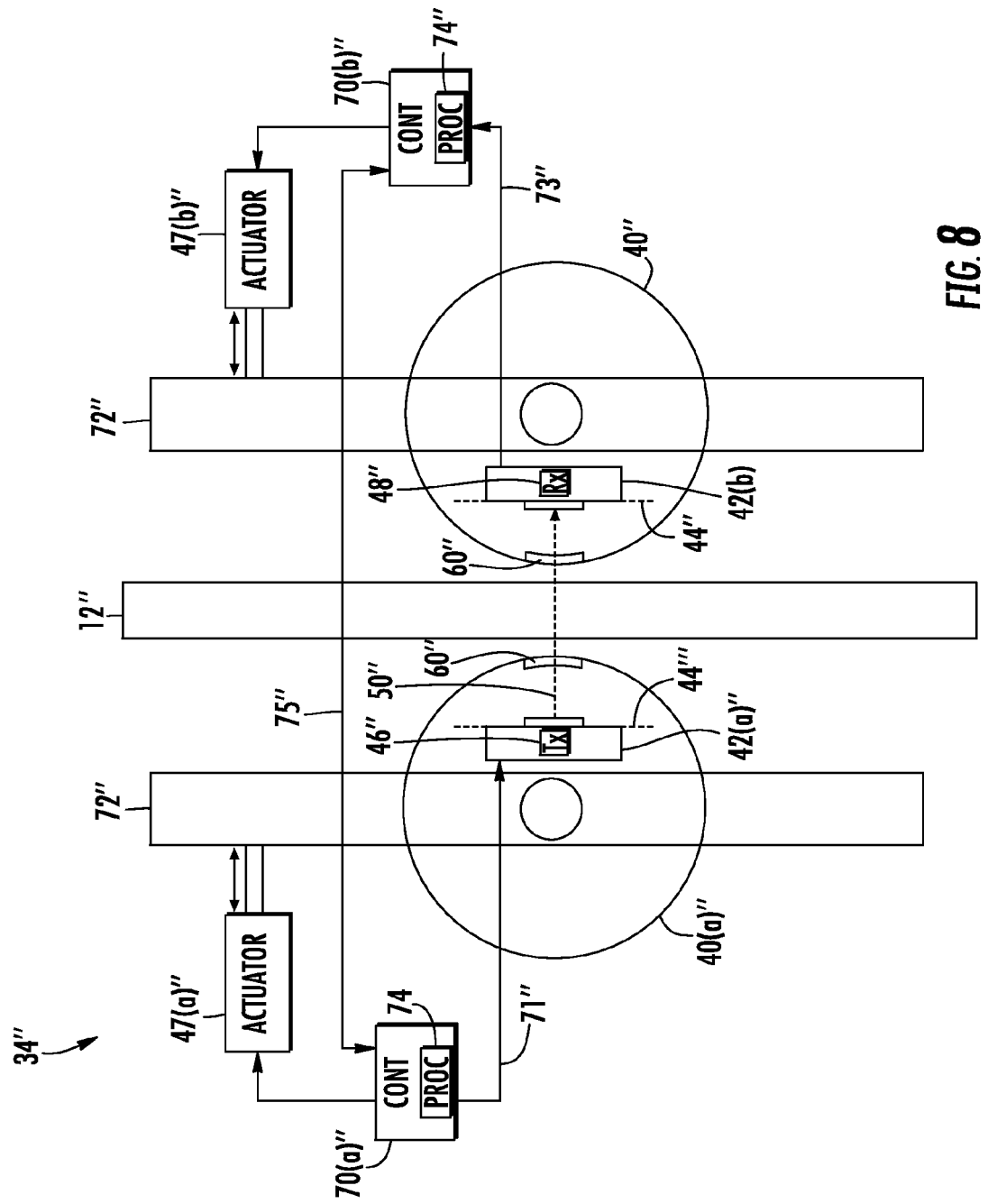
FIG. 8 is a schematic diagram of a different embodiment of a brush cleaning apparatus with coordinated optical sensing devices inside the rotary brushes in accordance with the present invention.

Yet another embodiment of the brush cleaning apparatus 34" will now be discussed in reference to FIG. 8. In this embodiment, the optical sensing devices 42" between the rotary brushes 40" coordinate with one another through the semiconductor wafer 12". For example, a first optical sensing device 42(a)" includes a transmitter 46" for transmitting an optical signal 50" that is transparent to the semiconductor wafer 12". On the opposite side of the semiconductor wafer 12", a second optical sensing device 42(b)" includes a receiver 48" for receiving the optical signal 50" transmitted by the transmitter 46" and through the semiconductor wafer 12".

The received optical signal 50" is used to sense the separation distance with respect to the reference position 44". The frequency of the optical signal 50" may be in the infrared range, such as 155 nm, for example. Other frequencies allowing the transmitter 46" and receiver 48" to communicate through the semiconductor wafer 12" are also acceptable, as readily appreciated by those skilled in the art.

A first actuator 47(a)" is coupled to the first optical sensing device 42(a)" and is configured to position the first rotary brush 40(a)" based upon the sensed separation distance. A second actuator 47(b)" is coupled to the second optical sensing device 42(b)" and is configured to position the second rotary brush 40(b)" based upon the sensed separation distance. The transmitted optical signal 50" includes a desired separation distance so that the first and second actuators 47(a)", 47(b)" both position the first and second rotary brushes 40(a)", 40(b)" to the desired separation distance.

Determination of the desired separation distance is determined ahead of time, and corresponds to the types of semiconductor wafers 12" being cleaned, as well as the types of brushes 40" being used to clean the wafers. The determination may be based on trial and error, for example. Based on a selected separation distance, the semiconductor wafer 12" is cleaned. Afterwards, the semiconductor wafer 12" is tested to determine wafer yield.

This process is repeated for other different separation distances, with each of the corresponding semiconductor wafers 12" being tested afterwards. After trial and error, the separation distance allowing for the best wafer yield is selected.

When subsequent semiconductor wafers 12" are to be brushed, the first and second optical sensing devices 42(a)", 42(b)" sense a separation distance of the first and second rotary brushes 40(a)", 40(b)" with respect to the next wafer to be cleaned. The information content of the optical signal 50''' to be transmitted between the two optical sensing devices 42(a)''', 42(b)''' corresponds to the selected separation distance allowing for the best wafer yield. One or both controllers 70(a)''', 70(b)''' receive this information from the first and second optical sensing devices 42(a)''', 42(b)''' so as to control positioning of the first and second rotary brushes 40(a)''', 40(b)'''. This process is repeated for the next semiconductor wafer 12'''.

Figure 9:
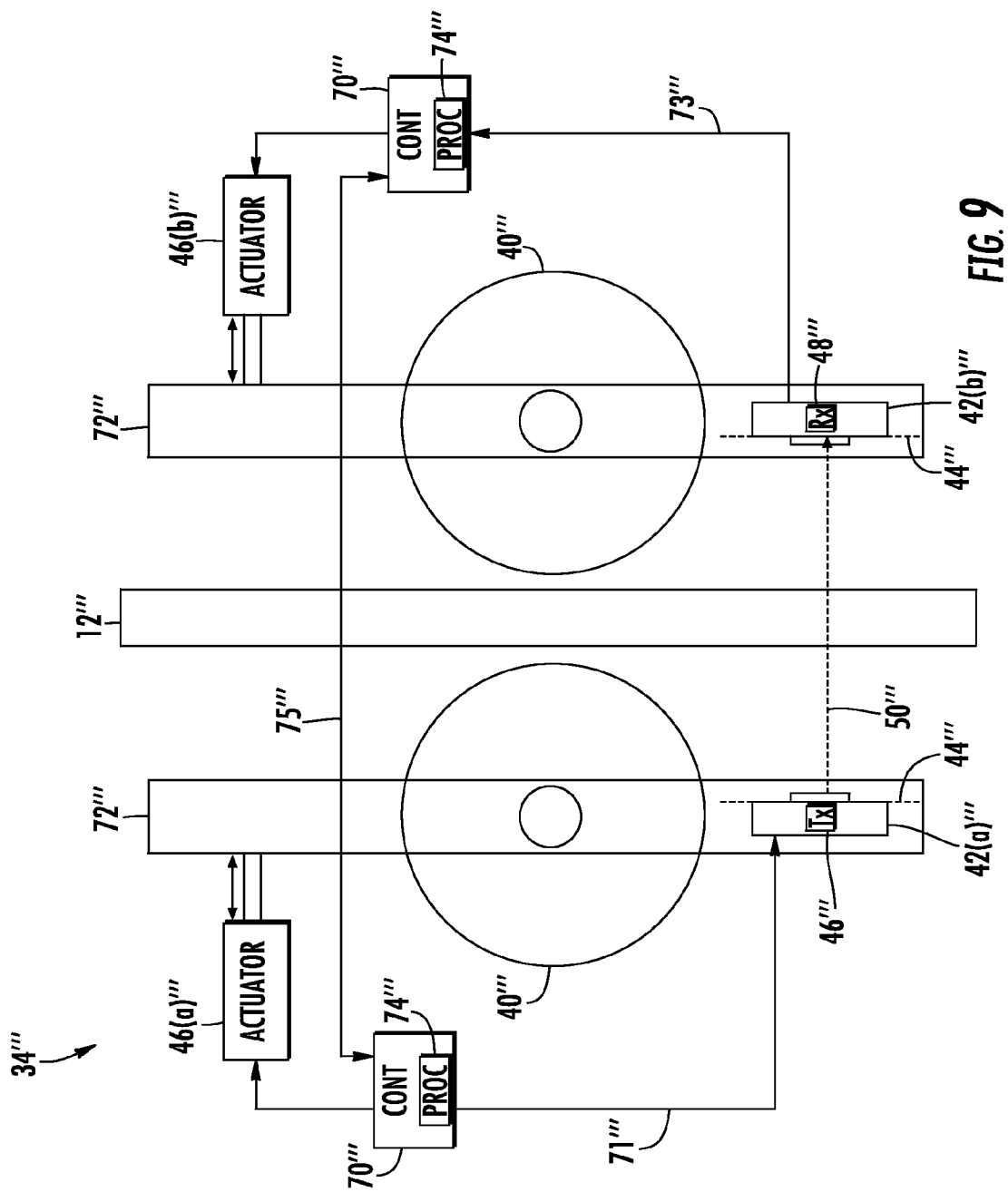
FIG. 9 is a schematic diagram of the brush cleaning apparatus shown in FIG. 8 with the coordinated optical sensing devices outside the rotary brushes.
Figure 10:
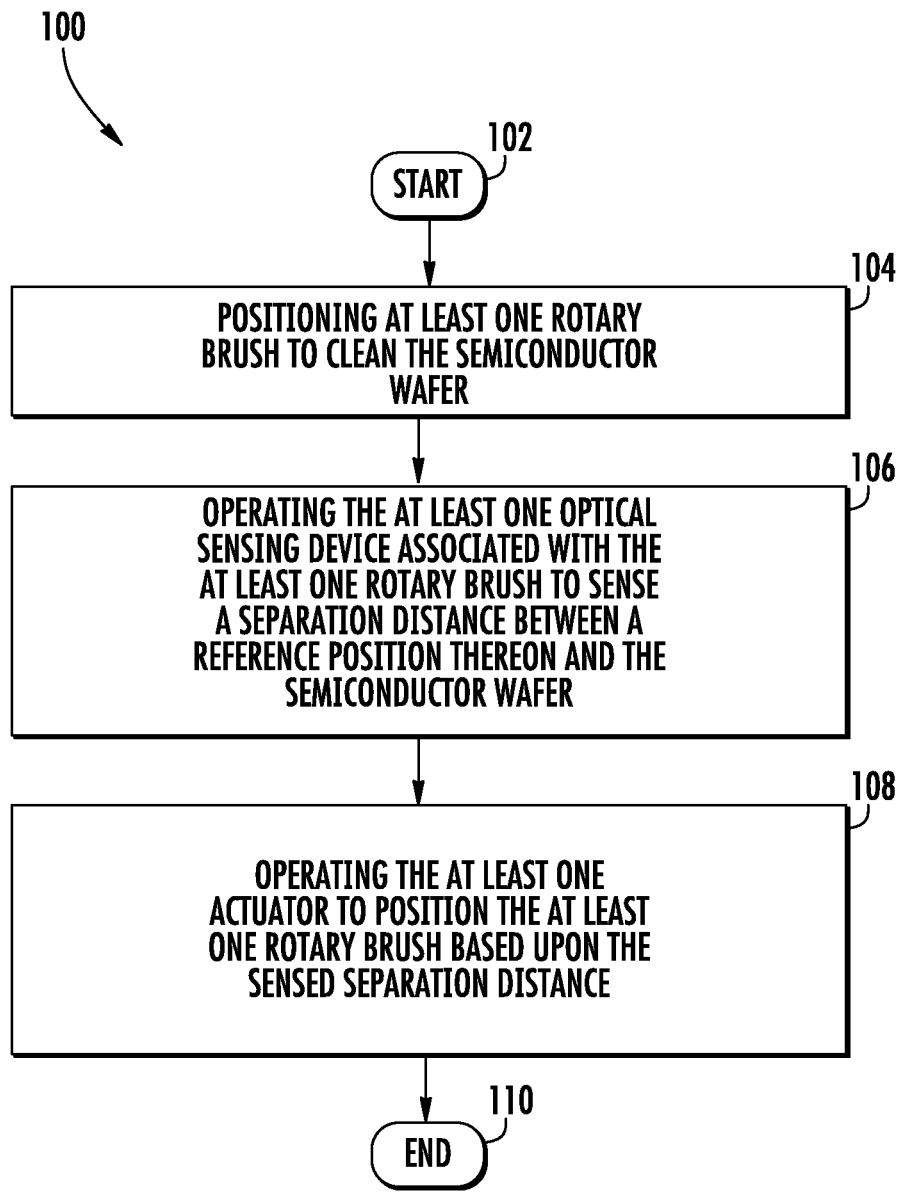
FIG. 10 is a flowchart illustrating a method for cleaning a semiconductor wafer in accordance with the present invention.

Referring now to FIG. 9, another embodiment of the brush cleaning apparatus 34''' is based on the optical sensing devices 42(a)''' and 42(b)''' being external the rotary brushes 40'''. For example, the optical sensing devices 42(a)''' and 42(b)''' are carried by the arms 72''' used to support at least one side of the rotary brushes 40'''. In this embodiment, the rotary brushes 40''' no longer require an optical window.

A flowchart 100 for illustrating a method for cleaning a semiconductor wafer 12 with an apparatus 34 as described above will now be discussed. From the start (Block 102), the method comprises positioning the at least one rotary brush 40 to clean the semiconductor wafer 12 at Block 104. The at least one optical sensing device 42 associated with the at least one rotary brush is operated at Block 106 to sense a separation distance between a reference position 44 thereon and the semiconductor wafer 12. The at least one actuator 47 is operated at Block 108 to position the at least one rotary brush 40 based upon the sensed separation distance. The method ends at Block 110.

Figure 11:
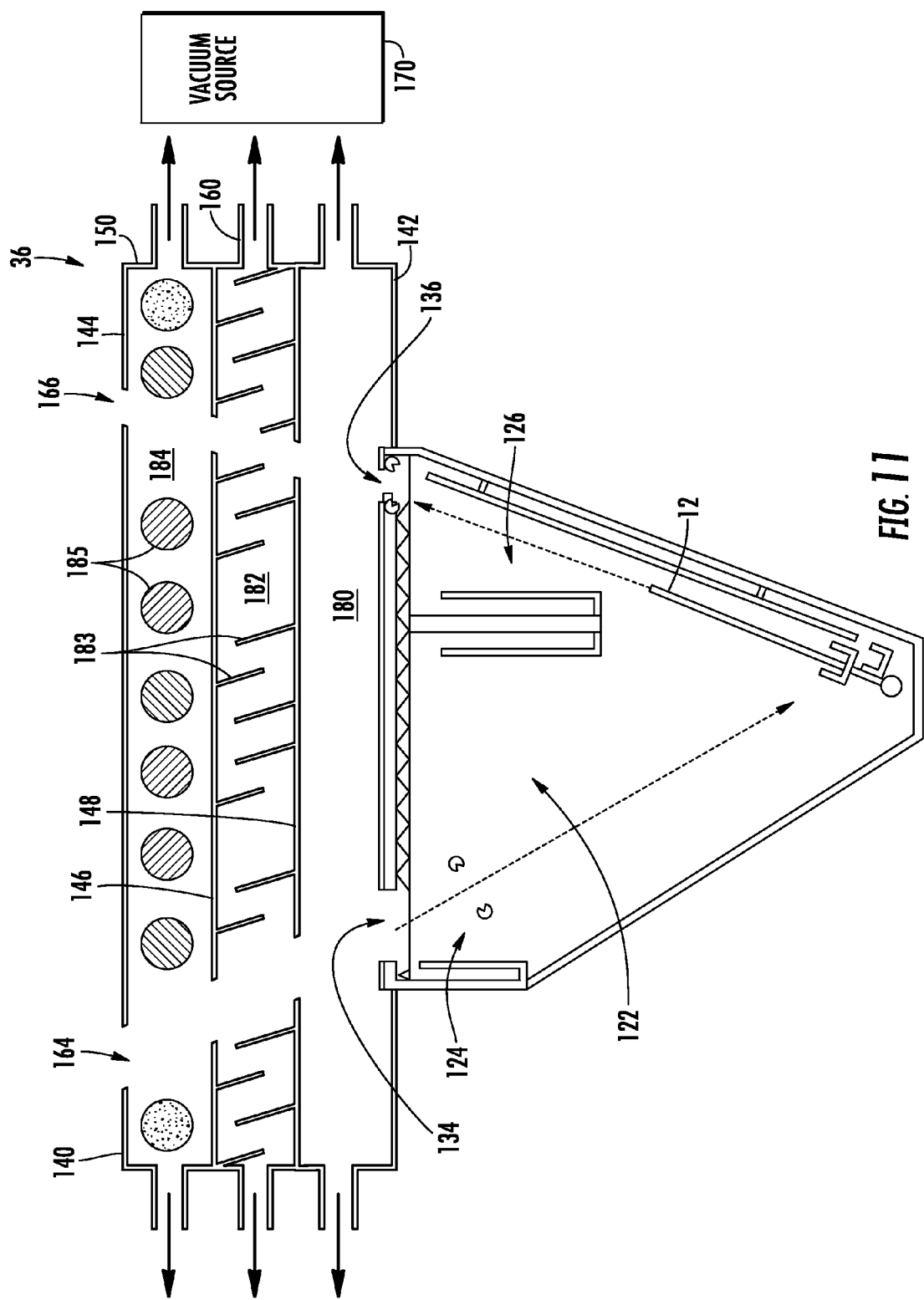
FIG. 11 is a cross-sectional side view of a drying apparatus with an exhaust control cap in accordance with the present invention.

Referring now to FIG. 11, the drying apparatus 36 for drying a semiconductor wafer 12 will now be discussed in greater detail. After each semiconductor wafer 12 has been brushed twice, the next cleaning station is the drying apparatus 36. The drying apparatus 36 is also known as a spin-rinse/dryer.

The drying apparatus 36 includes a processing chamber 122 that comprises a rinsing section 124 and a drying section 126 adjacent thereto. The rinsing section 124 has a chamber loading slot 134 associated therewith for receiving the semiconductor wafer 12. The drying section 126 has a chamber unloading slot 136 associated therewith for outputting the semiconductor wafer 12.

An exhaust control cap 140 is carried by the processing chamber 122 and includes a bottom wall 142, a top wall 144, and at least one intermediate wall 146 between the bottom and top walls. In the illustrative embodiment, there is an additional intermediate wall 148. A side wall 150 is coupled to the bottom wall 142, the intermediate walls 146, 148 and the top wall 144 to define a plurality of stacked or parallel exhaust sections 180, 182, 184.

The exhaust control cap 140 has a cap loading slot 164 aligned with the chamber loading slot 134, a cap unloading slot 166 aligned with the chamber unloading slot 136, and at least one exhaust port 160 configured to be coupled to a vacuum source 170. Even though cap loading slot 164 and the cap unloading slot 166 are illustrated as being spaced apart and separate from one another, in an alternate embodiment they may be formed as a single slot that is shared for loading and unloading the semiconductor wafers 12.

Alignment of the cap loading slot 164 with the chamber loading slot 134 may be at an angle, as illustrated in FIG. 11. The angle is in a non-vertical direction with respect to an upper surface of the processing chamber 122. The angle corresponds to a direction of travel of the semiconductor wafer 12 as it enters the rinsing section 124 of the processing chamber 122. The angle will vary between different embodiments of a drying apparatus 36 to support the actual direction of travel of the wafer 12. Similarly, alignment of the cap unloading slot 166 with the chamber unloading slot 136 may also be in a non-vertical direction with respect to an upper surface of the processing chamber 122, as illustrated in FIG. 11. The angle corresponds to a direction of travel of the semiconductor wafer 12 as it leaves the drying section 126 of the processing chamber 122. The angle will vary between different embodiments of the drying apparatus 36. For example, the angles may both be in a vertical direction with respect to the processing chamber 122, for example.

In the illustrative embodiment, the exhaust control cap 140 comprises a plurality of stacked exhaust sections 180, 182, 184. The exhaust control cap 140 is not limited to any particular number of exhaust sections. In addition, the exhaust control cap 140 is not limited to any particular configuration. The different configurations of the exhaust sections will now be discussed.

Exhaust section 180 is configured as a hollow section for fast exhaust control. The hollow section is free of any obstruction.

Exhaust section 182 is configured as a baffled section to prevent an exhaust backstream. The illustrated baffles 183 are staggered. However, other configurations for providing a baffled section are readily acceptable.

Exhaust section 184 is configured as a chemical species trap section for trapping and absorbing exhaust molecules. The illustrated chemical species trap 185 is configured as a plurality of spaced apart circular tabs. Adhesive may be used to secure the trap 185 to the exhaust section 184. However, other configurations for providing the chemical species trap 185 are readily acceptable. For example, the chemical species trap 185 may be configured as a rectangular strip.

In the illustrated embodiment, each exhaust section 180, 182, 184 has at least one exhaust port 160 associated therewith. The exhaust control cap 140 advantageously contains and exhausts vapor from the processing chamber 122 of the drying apparatus 36, and in particular, in the drying section 126. The stacked exhaust sections also help to reduce exhaust contamination of the semiconductor wafer 12 as it is being removed from the drying apparatus 36. Also, as the semiconductor wafer 12 is removed, the exhaust control cap 140 helps to prevent DI water or an IPA flow rate spike from causing a water mark or IPA to condense on the semiconductor wafer. This helps to improve wafer yield and reliability being decreased.

Figure 12:
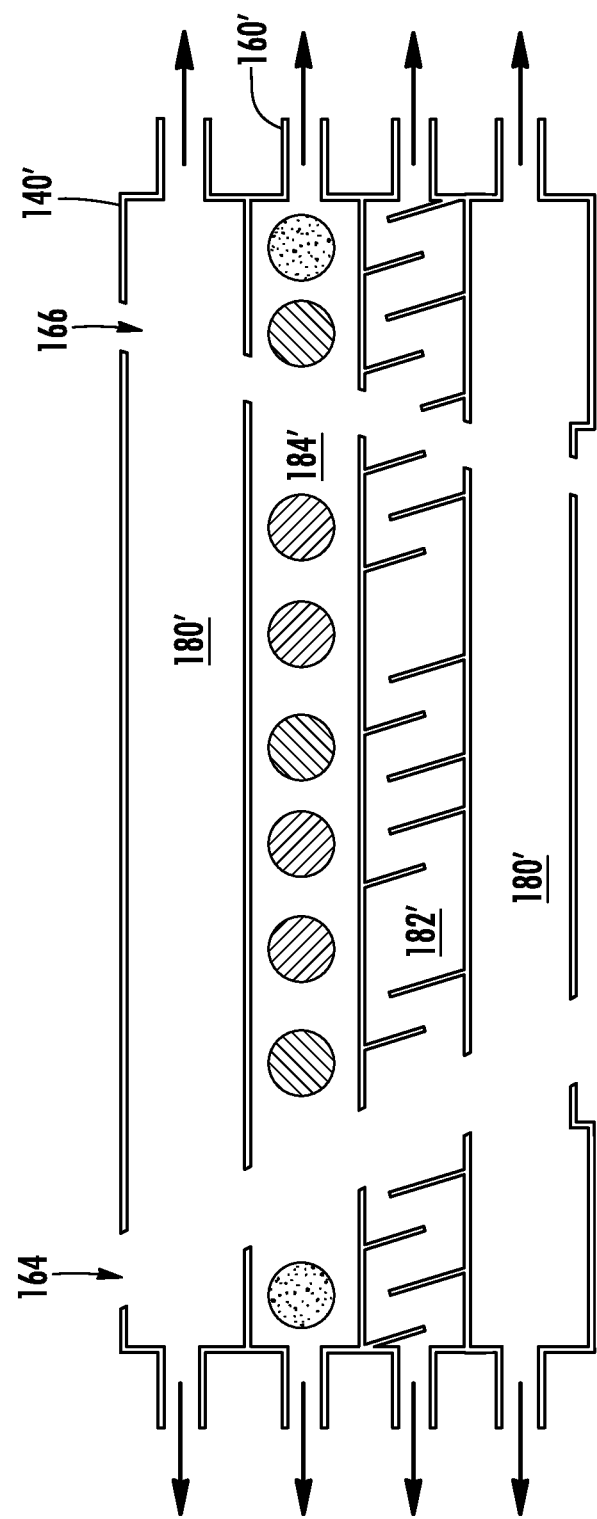
Figure 17:
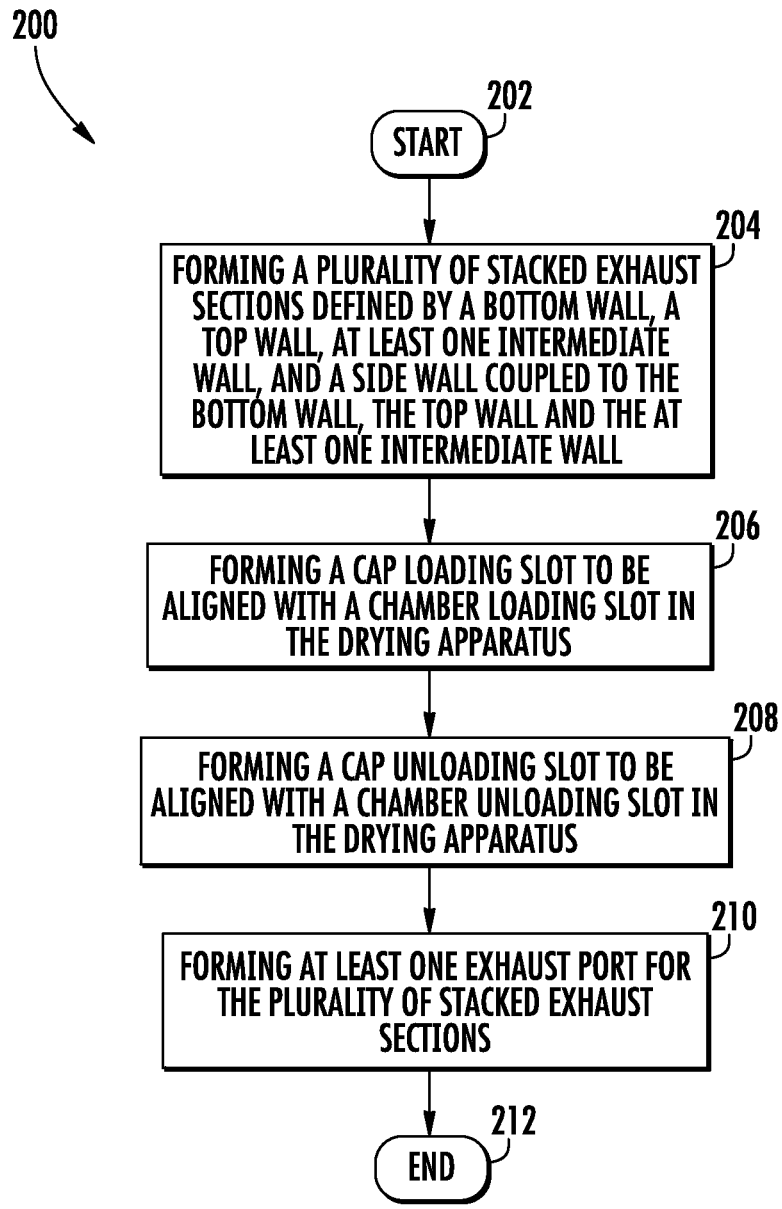
FIG. 17 is a flowchart illustrating a method for making an exhaust control cap in accordance with the present invention.

As noted above, the exhaust control cap 140 is not limited to any particular number of exhaust sections, or any particular configuration or order of the exhaust sections. For example, for the exhaust control cap 140' illustrated in FIG. 12 includes an additional hollow exhaust section 180'. For the exhaust control cap 140" illustrated in FIG. 13, only the hollow exhaust section 180" and the baffled exhaust section 182" are included. For the exhaust control cap 140''' illustrated in FIG. 14, only the hollow exhaust section 180''' and the chemical species trap section 184''' are included.

Referring now to FIGS. 15 and 16, the exhaust control cap 140 may further comprise cap loading slot doors 190 and cap unloading slot doors 194 that are slidably positioned to provide further exhaust control. The cap loading slot doors 190 are slideably positioned over the cap loading slot 164. Similarly, the cap unloading slot doors 194 are slideably positioned over the cap unloading slot 166.

A door controller 196 operates the cap loading and unloading slot doors 190, 194 based on a position of the semiconductor wafer 12. In FIG. 15, the cap loading and unloading slot doors 190, 194 are open. In FIG. 16, the cap loading and unloading slot doors 190, 194 are closed.

Even though each exhaust section has its own corresponding cap loading and unloading slot doors 190, 194, this may not always be the case. Selected exhaust sections may have cap loading and unloading slot doors 190, 194. Alternatively, only the upper or outer most exhaust section may have cap loading and unloading slot doors 190, 194.

A flowchart 200 for illustrating a method for making an exhaust control cap 140 for a semiconductor wafer drying apparatus 36 as described above will now be discussed. From the start (Block 202) the method comprising forming at Block 204 a plurality of stacked exhaust sections 180, 182, 184 defined by a bottom wall, a top wall, at least one intermediate wall, and a side wall coupled to the bottom wall, the top wall and the at least one intermediate wall. A cap loading slot 164 is formed at Block 206 to be aligned with a chamber loading slot 134 in the drying apparatus 36. A cap unloading slot 166 is formed at Block 208 to be aligned with a chamber unloading slot 136 in the drying apparatus 36. The method further comprises forming at least one exhaust port 160 for the plurality of stacked exhaust sections 180, 182, 184 to be coupled to a vacuum source 170. The method ends at Block 212.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A drying apparatus for drying a semiconductor wafer comprising:
    a processing chamber comprising a rinsing section and a drying section adjacent thereto, with the rinsing section having a chamber loading slot associated therewith for receiving the semiconductor wafer, and with the drying section having a chamber unloading slot associated therewith for outputting the semiconductor wafer; and
    an exhaust control cap carried by said processing chamber and comprising a bottom wall, a top wall, at least one intermediate wall between said bottom and top walls, and spaced apart outer side walls coupled to said top wall, said bottom wall and said at least one intermediate wall to define a plurality of stacked exhaust sections, with each stacked exhaust section extending between said spaced apart outer side walls, said exhaust control cap having
        a cap loading slot extending through said bottom wall, said top wall, and said at the least one intermediate wall and aligned with the chamber loading slot,
        a cap unloading slot extending through said bottom wall, said top wall, and said at the least one intermediate wall and aligned with the chamber unloading slot, and
        at least one exhaust port in one of said outer side walls and configured to be coupled to a vacuum source.

2. The drying apparatus according to claim 1, wherein the cap and chamber loading slots are aligned in a non-vertical direction with respect to an upper surface of said processing chamber, and wherein the cap and chamber unloading slots are also aligned in a non-vertical direction with respect to the upper surface of said processing chamber.

3. The drying apparatus according to claim 1, wherein said plurality of stacked exhaust sections includes at least one hollow section.

4. The drying apparatus according to claim 1, wherein said plurality of stacked exhaust sections includes at least one baffled section.

5. The drying apparatus according to claim 1, wherein said plurality of stacked exhaust sections includes at least one chemical species trap section.

6. The drying apparatus according to claim 1, wherein said at least one exhaust port comprises at least one exhaust port for each stacked exhaust section.

7. The drying apparatus according to claim 1, wherein said exhaust control cap further comprises:
    at least one cap loading slot door slideably positioned over the cap loading slot; and
    at least one cap unloading slot door slideably positioned over the cap unloading slot.

8. The drying apparatus according to claim 7, further comprising a door controller configured to operate said at least one cap loading and unloading slot doors based on a position of the semiconductor wafer.

9. The drying apparatus according to claim 1, further comprising the vacuum source coupled to said at least one exhaust port.

10. An exhaust control cap for a semiconductor wafer drying apparatus comprising a processing chamber having a chamber loading slot for receiving a semiconductor wafer and a chamber unloading slot for outputting the semiconductor wafer, the exhaust control cap comprising:
    a plurality of stacked exhaust sections defined by a bottom wall, a top wall, at least one intermediate wall, and spaced apart outer side walls coupled to said top wall, said bottom wall and said at least one intermediate wall, with each stacked exhaust section extending between said spaced apart outer side walls;
    said plurality of stacked exhaust sections having
        a cap loading slot extending through said bottom wall, said top wall, and said at the least one intermediate wall and configured to be aligned with the chamber loading slot in the processing chamber,
        a cap unloading slot extending through said bottom wall, said top wall, and said at the least one intermediate wall and configured to be aligned with the chamber unloading slot in the processing chamber,
        with the cap loading slot being spaced apart from the cap unloading slot, and
        at least one exhaust port in one of said outer side walls and configured to be coupled to a vacuum source.

11. The exhaust control cap according to claim 10, wherein said plurality of stacked exhaust sections includes at least one hollow section.

12. The exhaust control cap according to claim 10, wherein said plurality of stacked exhaust sections includes at least one baffled section.

13. The exhaust control cap according to claim 10, wherein said plurality of stacked exhaust sections includes at least one chemical species trap section.

14. The exhaust control cap according to claim 10, wherein said at least one exhaust port comprises at least one exhaust port for each exhaust section.

15. The exhaust control cap according to claim 10, further comprising:
    at least one cap loading slot door slideably positioned over the cap loading slot; and
    at least one cap unloading slot door slideably positioned over the cap unloading slot.

16. The exhaust control cap according to claim 15, further comprising a door controller configured to operate said at least one cap loading and unloading slot doors based on a position of the semiconductor wafer.

17. A method for making an exhaust control cap for a semiconductor wafer drying apparatus comprising:

forming a plurality of stacked exhaust sections defined by a bottom wall, a top wall, at least one intermediate wall, and spaced apart outer side walls coupled to the bottom wall, the top wall and the at least one intermediate wall, with each stacked exhaust section extending between the spaced apart outer side walls;

forming a cap loading slot extending through the bottom wall, the top wall, and the at the least one intermediate wall and to be aligned with a chamber loading slot in the drying apparatus;

forming a cap unloading slot extending through the bottom wall, the top wall, and the at the least one intermediate wall and to be aligned with a chamber unloading slot in the drying apparatus, with the cap loading slot being spaced apart from the cap unloading slot; and forming at least one exhaust port in one of the outer side walls for the plurality of stacked exhaust sections to be coupled to a vacuum source.

18. The method according to claim 17, wherein the cap and chamber loading slots are aligned in a non-vertical direction with respect to an upper surface of the drying apparatus, and wherein the cap and chamber unloading slots are also aligned in a non-vertical direction with respect to the upper surface of the drying apparatus.

19. The method according to claim 17, wherein the plurality of stacked exhaust sections includes at least one hollow section.

20. The method according to claim 17, wherein the plurality of stacked exhaust sections includes at least one baffled section.

21. The method according to claim 17, wherein the plurality of stacked sections includes at least one chemical species trap section.

22. The method according to claim 17, wherein the at least one exhaust port comprises at least one exhaust port for each exhaust section.

23. The method according to claim 17, further comprising:
forming at least one cap loading slot door slideably positioned over the cap loading slot; and
forming at least one cap unloading slot door slideably positioned over the cap unloading slot.

24. The method according to claim 23, further comprising providing a door controller configured to operate the at least one cap loading and unloading slot doors based on a position of the semiconductor wafer.

* * * * *